(12) United States Patent  (10) Patent No.: US 8,890,333 B2
Lee et al.  (45) Date of Patent: Nov. 18, 2014

(54) APPARATUS FOR STACKED SEMICONDUCTOR CHIPS

(71) Applicant: Samsung Electronics Co., Ltd., Suwon-si (KR)

(72) Inventors: SeokHyun Lee, Hwaseong-si (KR); Jin-Woo Park, Seoul (KR); Taesung Park, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/886,758

(22) Filed: May 3, 2013

(65) Prior Publication Data

US 2014/0008818 A1    Jan. 9, 2014

(30) Foreign Application Priority Data

Jul. 6, 2012 (KR) .................. 10-2012-0073960

(51) Int. Cl.
*H01L 29/40* (2006.01)

(52) U.S. Cl.
USPC ........... 257/777; 257/686; 257/737; 257/783; 257/784

(58) Field of Classification Search
CPC .......... H01L 2224/06551; H01L 2224/24105; H01L 2224/24145; H01L 2224/32145; H01L 2224/48145
USPC ........................ 257/686, 737, 777–782, 784
See application file for complete search history.

(56) References Cited

U.S. PATENT DOCUMENTS

| | | | |
|---|---|---|---|
| 7,838,979 | B2 | 11/2010 | Oh |
| 8,319,327 | B2 | 11/2012 | Suh |
| 2005/0101056 | A1* | 5/2005 | Song et al. ............... 438/109 |
| 2008/0303131 | A1 | 12/2008 | McElrea et al. |
| 2009/0085224 | A1 | 4/2009 | Choi et al. |
| 2011/0248410 | A1 | 10/2011 | Avsian et al. |
| 2012/0018879 | A1 | 1/2012 | Shin et al. |
| 2012/0025396 | A1 | 2/2012 | Liao et al. |

FOREIGN PATENT DOCUMENTS

| | | |
|---|---|---|
| KR | 10-0513322 | 8/2005 |
| KR | 10-0631997 | 9/2006 |
| KR | 1020100037351 | 4/2010 |
| KR | 1020100050976 | 5/2010 |
| KR | 10-1060118 | 8/2011 |
| KR | 10-1158730 | 6/2012 |

* cited by examiner

*Primary Examiner* — Dung A. Le (74) *Attorney, Agent, or Firm* — Onello & Mello, LLP (57) ABSTRACT

Stacked semiconductor chips include a bonding-wire-free interconnection electrically connecting the semiconductor chips to each. An opening in an adhesion layer between the semiconductor chips may provide a path for the interconnection from a bonding pad on one semiconductor chip, along a sidewall insulation layer of the semiconductor chip, along a sidewall insulation layer of another semiconductor chip to a bonding pad on the other semiconductor chip.

7 Claims, 13 Drawing Sheets

APPARATUS FOR STACKED SEMICONDUCTOR CHIPS

CROSS-REFERENCE TO RELATED APPLICATIONS

This U.S. non-provisional patent application claims priority under 35 U.S.C. §119 to Korean Patent Application No. 10-2012-0073960, filed on Jul. 6, 2012, the entirety of which is incorporated by reference herein.

BACKGROUND

Embodiments in accordance with principles of inventive concepts relate to semiconductor devices and methods of fabricating the same and, more particularly, to stacked structures of semiconductor chips, semiconductor devices including stacked semiconductor chips, methods of fabricating stacked semiconductor chips, and methods of fabricating semiconductor devices which include stacked semiconductor chips.

Semiconductor chips may be stacked in a package in order to fabricate compact, light-weight, high-performance electronic products. A multi-chip stacked package, which may take the form of a "system-in-a-package," may include a semiconductor package that performs various functions of unit semiconductor devices. A multi-chip stacked package, such as a system-in-a-package may be thicker than, but equal in area (that is, planar size) to a common single-chip package, and, as a result, may be of particular use in portable products in order to pack a high degree of functionality into a relatively small volume.

SUMMARY

Exemplary embodiments in accordance with principles of inventive concepts may provide semiconductor devices with improved operation reliability.

Exemplary embodiments in accordance with principles of inventive concepts may provide methods of fabricating a semiconductor device with improved operation reliability.

In an exemplary embodiment in accordance with principles of inventive concepts, a stacked structure of semiconductor chips may include: semiconductor chips stacked in one direction; and an interconnection member electrically connecting the semiconductor chips to each other in the one direction. Each of the semiconductor chips may include: a first surface and a second surface opposite to each other and a sidewall connecting the first and second surfaces; a bonding pad disposed on the first surface; a passivation layer disposed on the first surface, the passivation layer including a first opening to expose the bonding pad; a sidewall-insulating layer disposed on the sidewall; and a first adhesion layer disposed on the passivation layer and the sidewall-insulating layer and having a second opening. The second opening may expose the bonding pad and extend from the bonding pad to the sidewall-insulating layer to expose a portion of the passivation layer and a portion of the sidewall-insulating layer. The interconnection member may be disposed on the exposed bonding pad, the exposed portion of the passivation layer, and the exposed portion of the sidewall-insulating layer and extend on the sidewall-insulating layer in the one direction to connect to an interconnection member of another semiconductor chip.

In an exemplary embodiment in accordance with principles of inventive concepts, the semiconductor chips may be the same type of semiconductor chip.

In an exemplary embodiment in accordance with principles of inventive concepts, each of the semiconductor chips may further include: a second adhesion layer disposed on the second surface.

In an exemplary embodiment in accordance with principles of inventive concepts, the sidewall-insulating layer may cover sidewalls of the second adhesion layer and the passivation layer.

In an exemplary embodiment in accordance with principles of inventive concepts, the sidewall-insulating layer may include an epoxy resin and/or an epoxy molding compound.

In an exemplary embodiment in accordance with principles of inventive concepts, the interconnection member may include copper.

In another aspect, a semiconductor device may include: the stacked structures of the semiconductor chips of the above; and a wiring substrate on which the stacked structure is mounted.

In an exemplary embodiment in accordance with principles of inventive concepts, the stacked structure may be mounted on the wire substrate with a flip-chip bonding process.

In still another aspect, a method of fabricating a stacked structure of semiconductor chips may include: preparing a wafer including semiconductor chips, each of the semiconductor chips having a bonding pad and a passivation layer having a first opening to expose the bonding pad; cutting the wafer to separate the semiconductor chips from each other; mounting the semiconductor chips on a carrier substrate; filling a space between the semiconductor chips with an insulating layer on the carrier substrate; forming a first adhesion layer having a second opening on the passivation layer of each of the semiconductor chips, the second opening exposing the bonding pad and portions of the passivation layer and the insulating layer in a direction from the bonding pad to the insulating layer; cutting the insulating layer to separate semiconductor chips respectively having sidewall-insulating layers from each other; stacking the semiconductor chips respectively having the sidewall-insulating layers in one direction; and forming an interconnection member disposed in the first and second openings and extending on the sidewall-insulating layer in the one direction.

In an exemplary embodiment in accordance with principles of inventive concepts, forming the interconnection member may include: forming a metal layer on the exposed bonding pad, the exposed portions of the passivation layer and the sidewall-insulating layer, and an outer sidewall of the sidewall-insulating layer by a plating process; and patterning the metal layer on the outer sidewall of the sidewall-insulating layer. The metal layer may be patterned using a laser etching process or a wet etching process.

In an exemplary embodiment in accordance with principles of inventive concepts, before cutting the wafer, the method may further include: forming a first adhesion layer on a rear surface of the wafer.

In an exemplary embodiment in accordance with principles of inventive concepts, the semiconductor chips may be the same type of semiconductor chip.

In an exemplary embodiment in accordance with principles of inventive concepts, the insulating layer fills the space to a level of the passivation layer.

In yet still another aspect, a method of fabricating a semiconductor device may include: mounting the stacked structure of the semiconductor chips fabricated by the method of the above on a wiring substrate.

In an exemplary embodiment in accordance with principles of inventive concepts, the stacked structure may be mounted on the wiring substrate with a flip-chip bonding process.

In an exemplary embodiment in accordance with principles of inventive concepts, an apparatus includes semiconductor chips, each having a bonding pad, stacked one on the other; a stack adhesion layer formed between the semiconductor chips; and a bonding-wire-free interconnection between a bonding pad on one chip and a bonding pad on another chip.

In an exemplary embodiment in accordance with principles of inventive concepts, each semiconductor chip in a stack has a sidewall with a sidewall insulation layer and the stack adhesion layer includes an opening from a bonding pad to the sidewall insulation layer, wherein the interconnection is formed within the opening.

In an exemplary embodiment in accordance with principles of inventive concepts, an interconnection includes a conductor extending from a semiconductor chip bonding pad to a sidewall insulation layer, along the sidewall insulation layer of the semiconductor chip to another semiconductor chip sidewall insulation layer, and from the sidewall insulation layer of the other semiconductor chip to a bonding pad of the other semiconductor chip.

In an exemplary embodiment in accordance with principles of inventive concepts, a memory device includes semiconductor chips, each having a bonding pad, stacked one on the other; a stack adhesion layer formed between the semiconductor chips; and a bonding-wire-free interconnection between a bonding pad on one chip and a bonding pad on another chip.

In an exemplary embodiment in accordance with principles of inventive concepts, a mobile phone includes semiconductor chips, each having a bonding pad, stacked one on the other; a stack adhesion layer formed between the semiconductor chips; and a bonding-wire-free interconnection between a bonding pad on one chip and a bonding pad on another chip.

BRIEF DESCRIPTION OF THE DRAWINGS

The inventive concept will become more apparent in view of the attached drawings and accompanying detailed description.

FIGS. 2A to 9A are cross-sectional views taken along a line I-I' of FIG. 1 for describing an exemplary method of fabricating stacked semiconductor chips in accordance with principles of inventive concepts;

FIGS. 2B to 9B are cross-sectional views taken along a line II-II' of FIG. 1 for describing an exemplary method of fabricating stacked semiconductor chips in accordance with principles of inventive concepts;

DETAILED DESCRIPTION OF THE EMBODIMENTS

Exemplary embodiments in accordance with principles of inventive concepts will now be described more fully with reference to the accompanying drawings, in which exemplary embodiments are shown. Exemplary embodiments in accordance with principles of inventive concepts may, however, be embodied in many different forms and should not be construed as being limited to the embodiments set forth herein; rather, these embodiments are provided so that this disclosure will be thorough and complete, and will fully convey the concept of exemplary embodiments to those of ordinary skill in the art. In the drawings, the thicknesses of layers and regions may be exaggerated for clarity. Like reference numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on"). The word "or" is used in an inclusive sense, unless otherwise indicated.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "bottom," "below," "lower," or "beneath" other elements or features would then be oriented "atop," or "above," the other elements or features. Thus, the exemplary terms "bottom," or "below" can encompass both an orientation of above and below, top and bottom. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments in accordance with principles of inventive concepts are described herein with reference to cross-sectional illustrations those are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments in accordance with principles of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments in accordance with principles of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
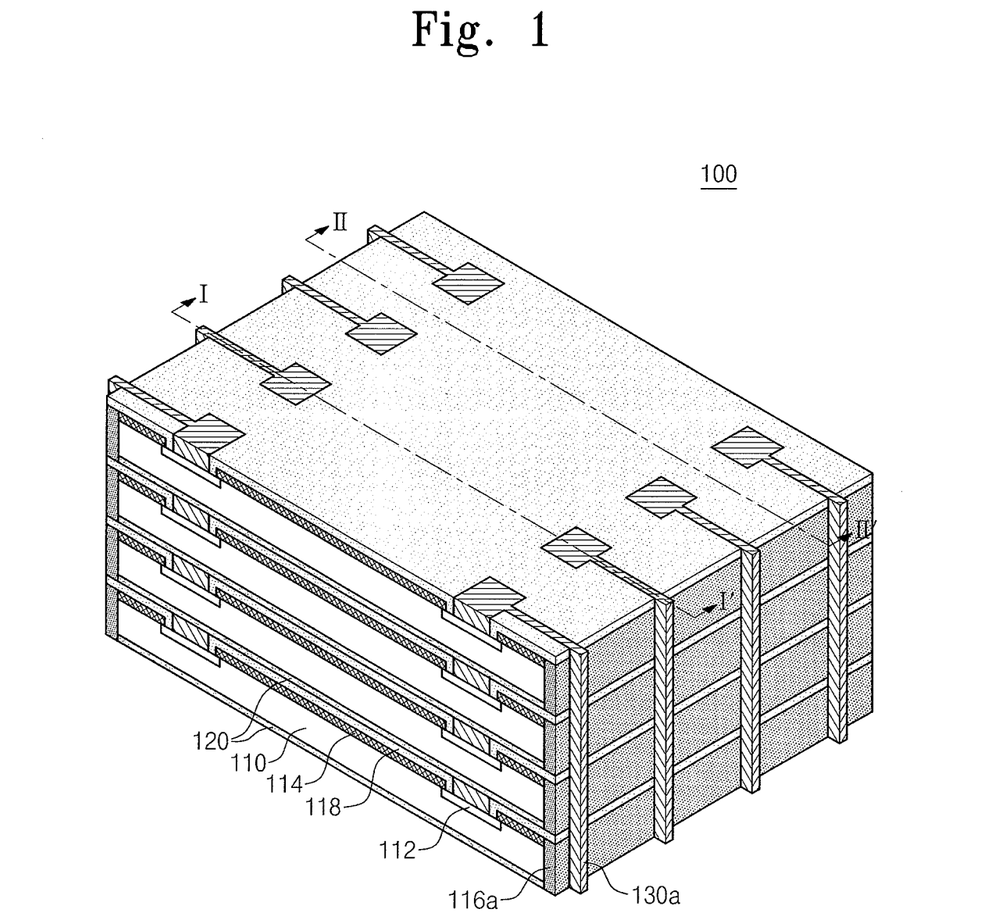
FIG. 1 is a perspective view illustrating an exemplary embodiment of stacked semiconductor chips in accordance with principles of inventive concepts.

FIG. 1 is a perspective view illustrating an exemplary embodiment of a stacked structure of semiconductor chips, or, simply, stacked semiconductor chips, in accordance with principles of inventive concepts. A stacked structure 100 may include semiconductor chips 110 stacked in one direction and metal interconnections 130a connecting the semiconductor chips 110 to each other in the one direction. That is, the stacked structure 100 may include the semiconductor chips 110 stacked "one on top of the other" in a "vertical" direction, with the metal interconnections 130a interconnecting the stacked semiconductor chips 110.

Each of the semiconductor chips 110 may have an active surface, an inactive, or, rear, surface opposite the active surface, and at least one sidewall connecting the active surface and the rear surface. In an exemplary embodiment in accordance with principles of inventive concepts, each semiconductor chips 110 may include bonding pads 112 disposed on the active surface, a rear surface-adhesion layer 120 disposed on the rear surface, a passivation layer 114 disposed on the active surface and exposing the bonding pads 112, a sidewall-insulating layer 116a disposed on the sidewall, and a stack-adhesion layer 118 disposed on the passivation layer 114 and the sidewall-insulating layer 116a. The stack-adhesion layer 118 may include openings, each of which may expose the bonding pad 112. In an exemplary embodiment in accordance with principles of inventive concepts, each of the openings of the stack-adhesion layer 118 may extend from respective bonding pads 112 to the sidewall-insulating layer 116a to expose a portion of the passivation layer 114 and a portion of the sidewall-insulating layer 116a. In an exemplary embodiment in accordance with principles of inventive concepts, all the stacked semiconductor chips 110 may be the same kind of semiconductor chip.

The rear surface-adhesion layer 120 and the stack-adhesion layer 118 may each include an adhesive resin having an electrically insulating property, may have a tape-shape or a hardened shape from a liquid state, and may include a photosensitive adhesive resin capable of being patterned by a photolithography process.

The passivation layer 114 may include a nitride, such as silicon nitride and/or silicon oxynitride, for example.

The sidewall-insulating layer 116a may include an epoxy resin and/or an epoxy molding compound (EMC). The sidewall-insulating layer 116a may insulate the sidewall of the semiconductor chip 110 and may cover the rear surface-adhesion layer 120 and the passivation layer 114, for example.

In an exemplary embodiment in accordance with principles of inventive concepts, the metal interconnection 130a may be disposed on the exposed bonding pad 112, the exposed portion of the passivation layer 114, and the exposed portion of the sidewall-insulating layer 116a. Additionally, the metal interconnection 130a may extend primarily in the one direction (that is, in the direction of stacking) on the sidewall-insulating layer 116a. The stacked semiconductor chips 110 may be electrically connected to each other by the metal interconnections 130a, which may include copper (Cu), for example.

In an exemplary embodiment in accordance with principles of inventive concepts, the stacked semiconductor chips 110 may be electrically connected to one another without the use of a bonding wire. In such exemplary embodiments, it is possible to avoid problems that otherwise may occur due to the use of a wire bonding process. That is, wires employed in the wire bonding process may be shorted, during a molding step, for example, or wire loops may prevent packages from being as compact as may be desired. The stacked structure 100 may, therefore, improve the reliability and allow for more compact packaging, when compared to a wire-bonded structure.

FIGS. 2A to 9A are cross-sectional views taken along a line I-I' of FIG. 1 and will be used to illustrate an exemplary method in accordance with principles of inventive concepts of fabricating a stacked structure of semiconductor chips. FIGS. 2B to 9B are cross-sectional views taken along a line II-II' of FIG. 1 and will be used to illustrate an exemplary method in accordance with principles of inventive concepts of fabricating a stacked structure of semiconductor chips.

Figure 2A:
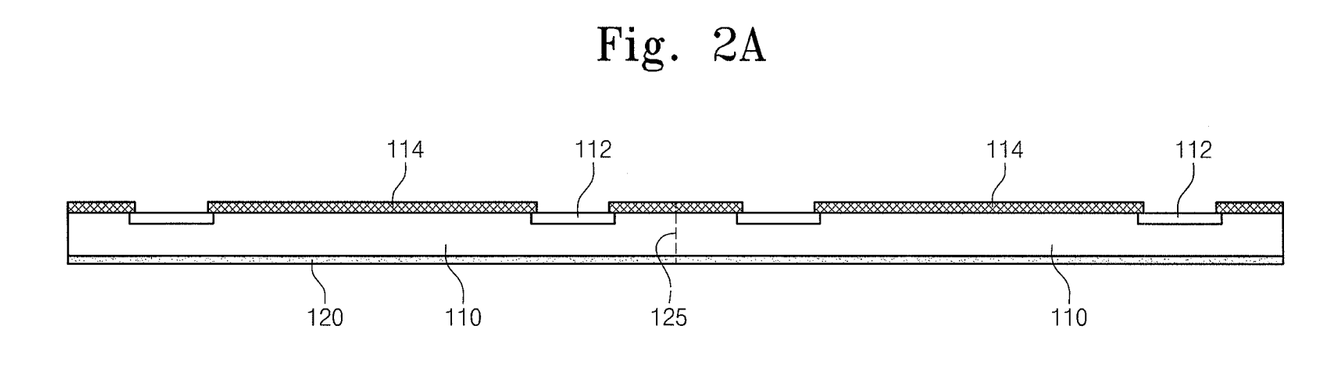
Figure 2B:
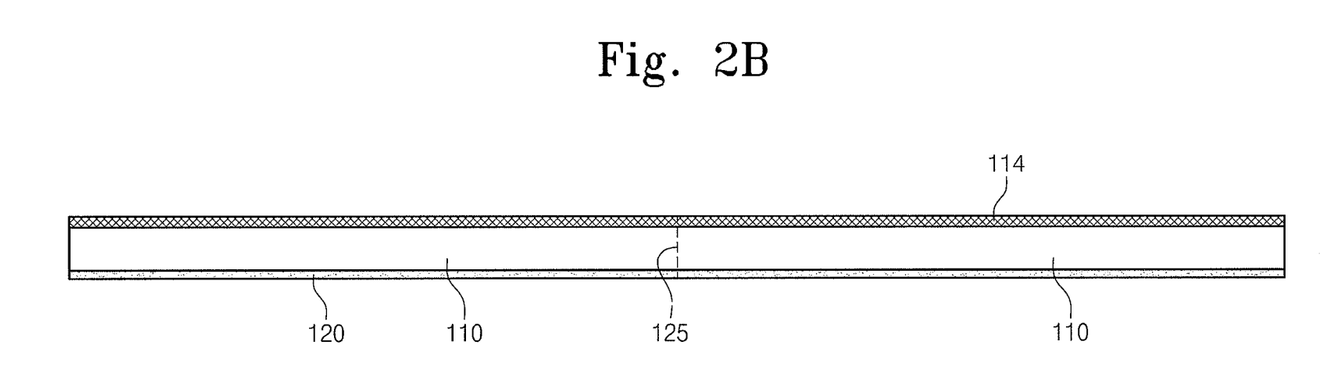

Referring to FIGS. 2A and 2B, a wafer may be prepared. The wafer may include semiconductor chips 110. Each of the semiconductor chips 110 may have bonding pads 112 and a passivation layer 114 exposing the bonding pads 112 (that is, leaving the boding pads 112 exposed). The passivation layer 114 may include a nitride such as silicon nitride and/or silicon oxynitride, for example.

In an exemplary embodiment in accordance with principles of inventive concepts, a rear surface of the wafer may be polished for thinning the semiconductor chips 110. A rear surface-adhesion layer 120, which may include an electrically insulating adhesive resin, may be formed on the polished rear surface of the wafer. The rear surface-adhesion layer 120 may have a tape-shape or a hardened shape from a liquid state (that is, a shape hardened from a liquid state). The rear surface-adhesion layer 120 may include a photosensitive adhesive resin capable of being patterned by a photolithography process, for example.

Alternatively, the rear surface-adhesion layer 120 may include a re-workable adhesive capable of easily being separated from the semiconductor chip 110 after bonding. In such an exemplary embodiment in accordance with principles of inventive concepts, the rear surface-adhesion layer 120 may be easily separated from the semiconductor chips 110 after the wafer is bonded to a handing wafer (also referred to herein as a handling wafer) through the rear surface-adhesion layer 120 and the wafer is then cut along a chip cutting region 125 to separate the semiconductor chips 110 from each other. For example, the re-workable adhesive of the rear surface-adhesion layer 120 may be an adhesive including an ultraviolet curable resin (UV resin) or a thermoplastic resin.

The handing wafer may be used for reducing a mechanical stress applied to the wafer in the process polishing the rear surface of the wafer and for suppressing warpage of the thinned wafer after the polishing process, for example, and may be formed of a material having a coefficient of thermal expansion (CTE) equal to, or similar to, that of the active wafer (that is, the wafer including semiconductor chips 110). For example, the handing wafer may be a silicon substrate or a glass substrate. The handing wafer may have the same circular plate-shape as the wafer.

Figure 3A:
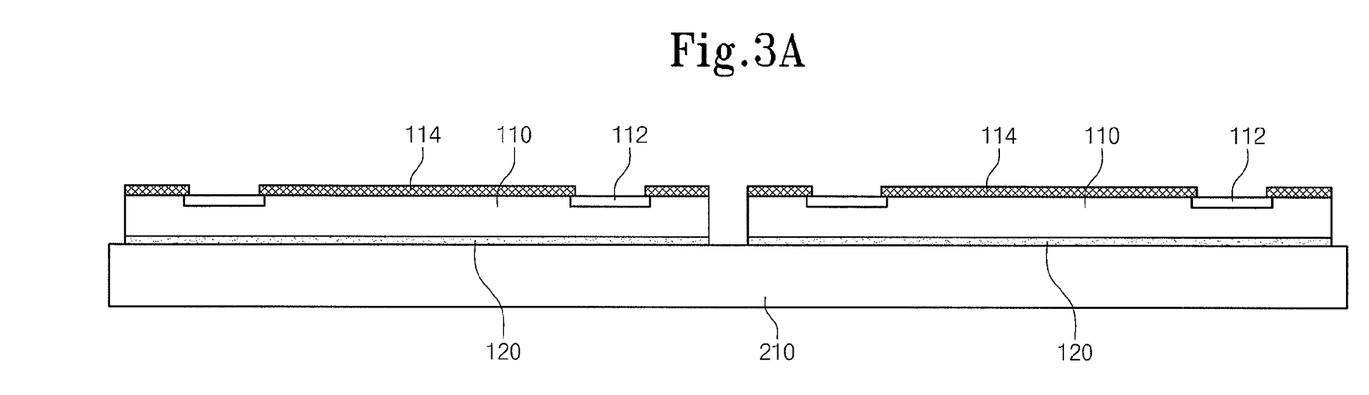
Figure 3B:
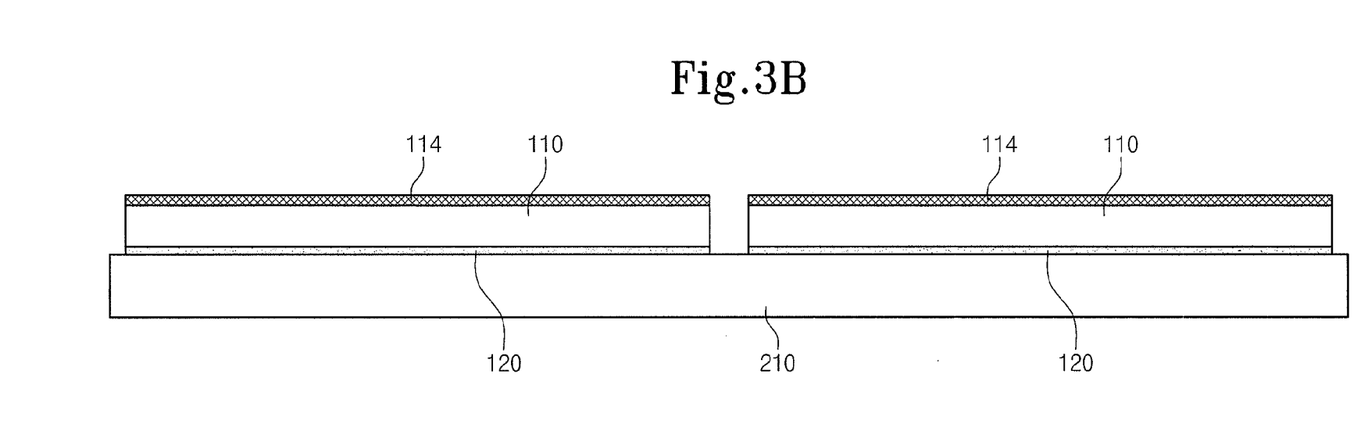

Referring to an exemplary embodiment in accordance with principles of inventive concepts illustrated in FIGS. 3A and 3B, the wafer may be cut using a cutting tool to separate the semiconductor chips 110 from each other. Subsequently, the semiconductor chips 110 may be mounted on a carrier substrate 210. The semiconductor chips 110 may be spaced apart from each other on the carrier substrate 210. The separated semiconductor chips 110 may be bonded to the carrier substrate 210 with the rear surface-adhesion layer 120 therebetween, for example.

Alternatively, in another exemplary embodiment in accordance with principles of inventive concepts, if the rear surface-adhesion layer 120 is removed from the semiconductor chips 110 after the wafer is cut, an additional adhesion layer (not shown) may be formed on a rear surface of each of the semiconductor chips 110. The additional adhesion layer may include an electrically-insulating adhesive resin and may have a tape-shape (for example, a shape defined by tape) or a hardened shape from a liquid state (for example, a shape defined in a material that is in a liquid state and then solidifies in the defined shape). The additional adhesion layer may include a photosensitive adhesive resin capable of being patterned by a photolithography process, for example.

Good semiconductor chips 110, that is, semiconductor chips 110 that pass a functionality test, may be selected from the separated semiconductor chips 110 and then be mounted on the carrier substrate 210.

Figure 4A:
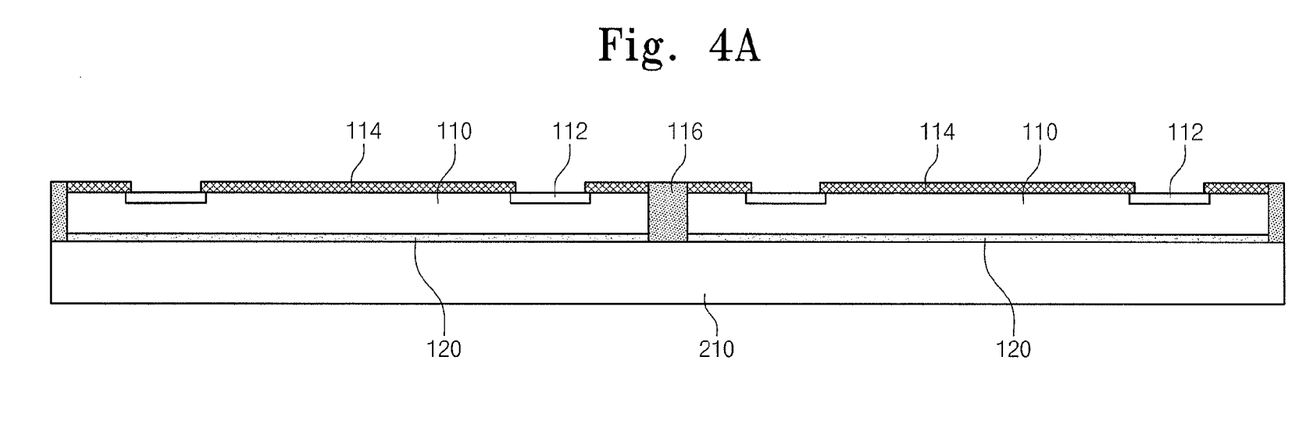
Figure 4B:
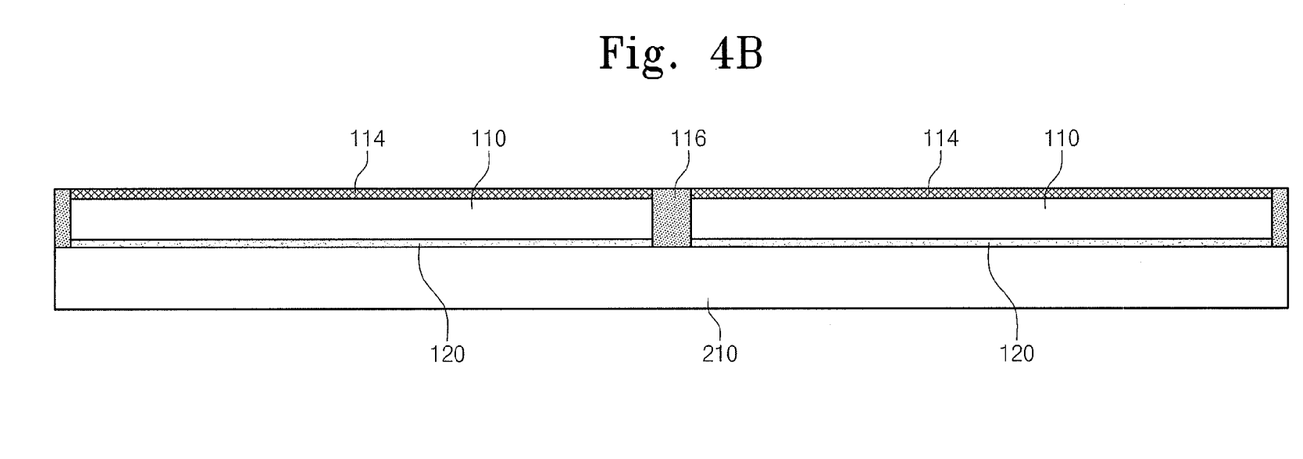

Referring to the exemplary embodiment in accordance with principles of inventive concepts of FIGS. 4A and 4B, an insulating layer 116 may fill a space between the semiconductor chips 110 mounted on the carrier substrate 210. The insulating layer 116, which may include an epoxy resin and/or an epoxy molding compound, may fill the space to a level of the passivation layer 114, for example.

Figure 5A:
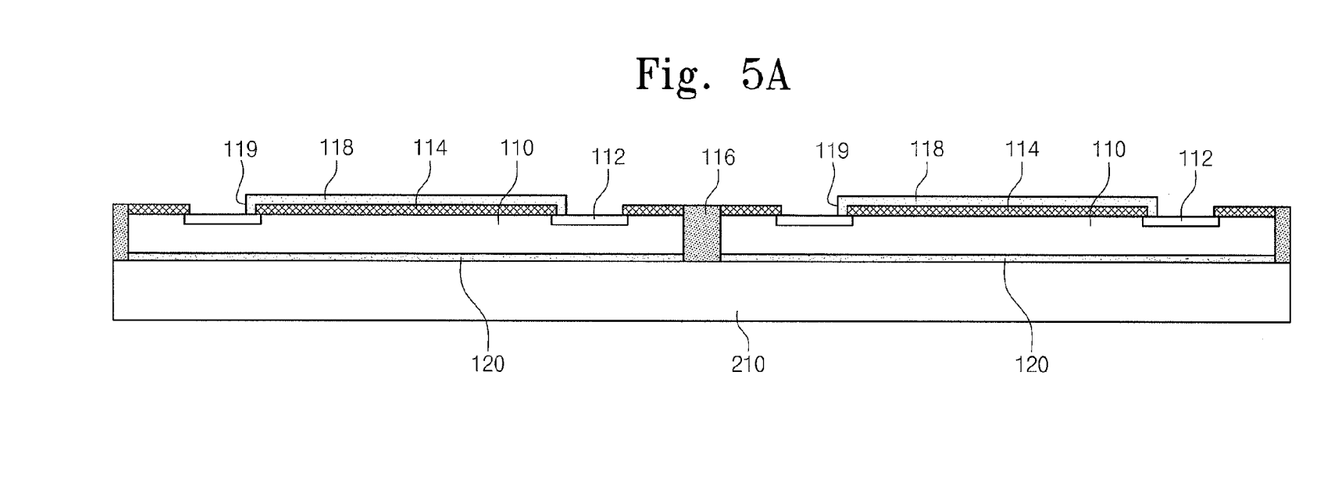
Figure 5B:
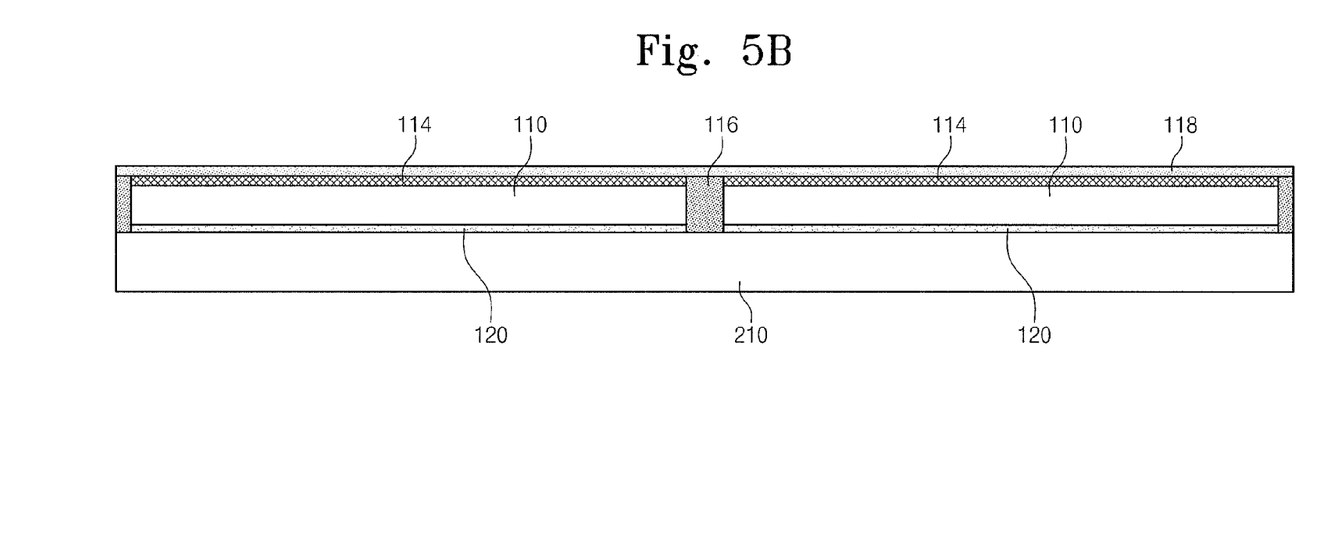

Referring FIGS. 5A and 5B, in an exemplary embodiment in accordance with principles of inventive concepts, a stack-adhesion layer 118 may be formed on the passivation layer 114 of each of the semiconductor chips 110. The stack-adhesion layer 118 may include openings 119, each of which may expose the bonding pad 112, and all bonding pads 112 may be exposed by the openings 119. The openings 119 may extend from each of the bonding pads 112 to the insulating layer 116 (or an edge of the semiconductor chip 110) to expose a portion of the passivation layer 114 and a portion of the insulating layer 116, for example.

The stack-adhesion layer 118 may include an electrically insulating adhesive resin and may have a tape-shape or a hardened shape from a liquid state. The stack-adhesion layer 118 may include a photosensitive adhesive resin capable of being patterned by a photolithography process.

Figure 6A:
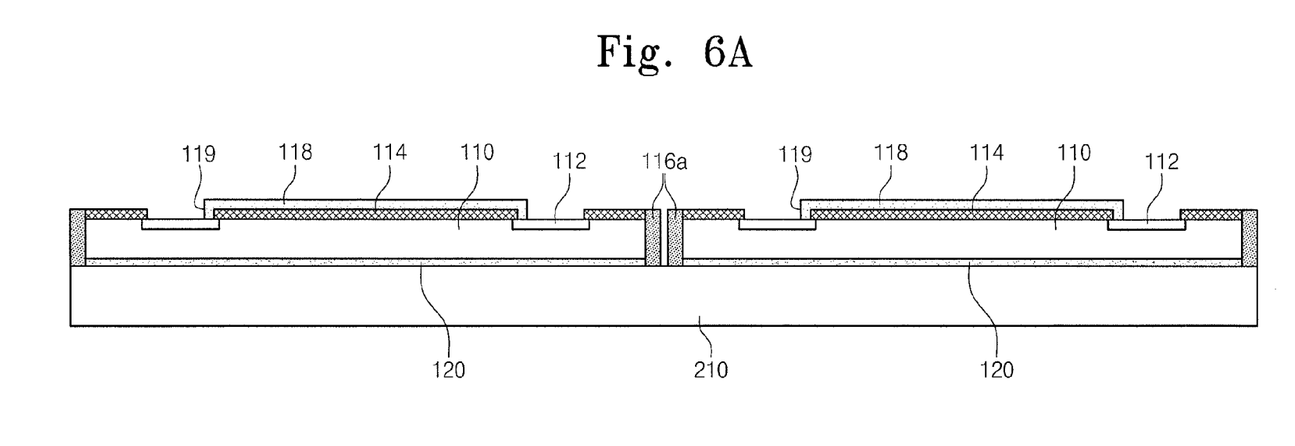
Figure 6B:
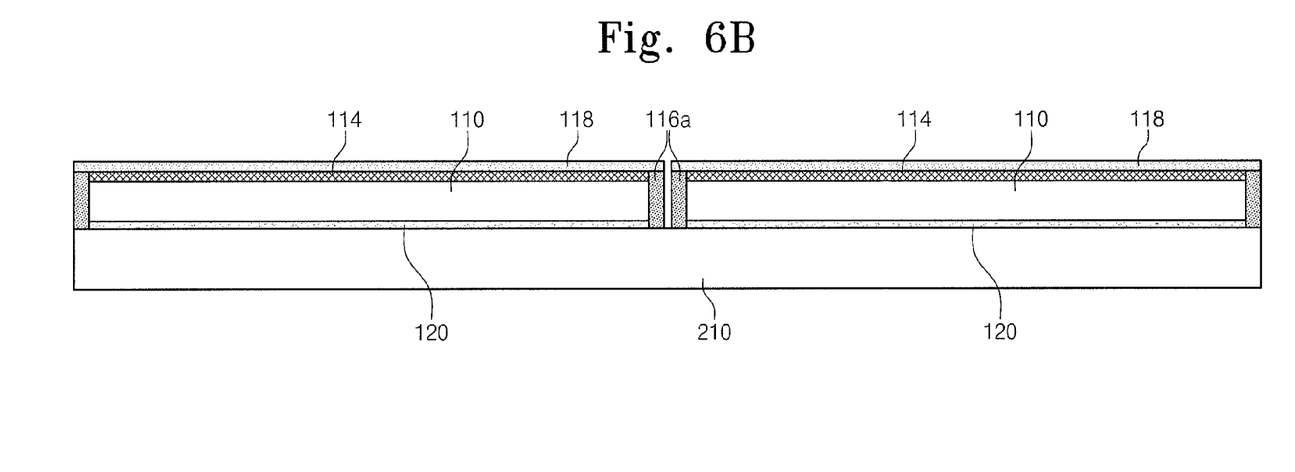

Referring to FIGS. 6A and 6B, in an exemplary embodiment in accordance with principles of inventive concepts, the insulating layer 116 may be cut to separate semiconductor chips 110 having sidewall-insulating layers 116a from each other. The insulating layer 116 may be cut by a cutting tool such as a laser cutter. In such an exemplary embodiment, the sidewall of each of the semiconductor chips 110 may thereby be electrically insulated.

Figure 7A:
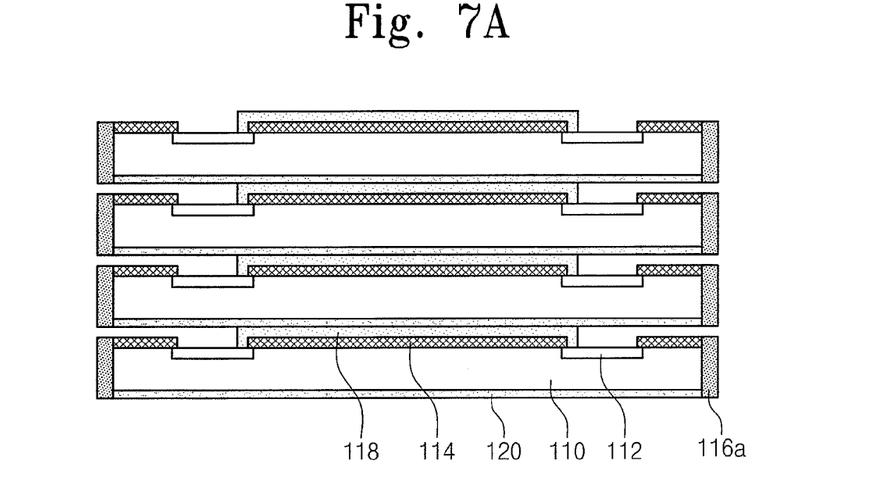
Figure 7B:
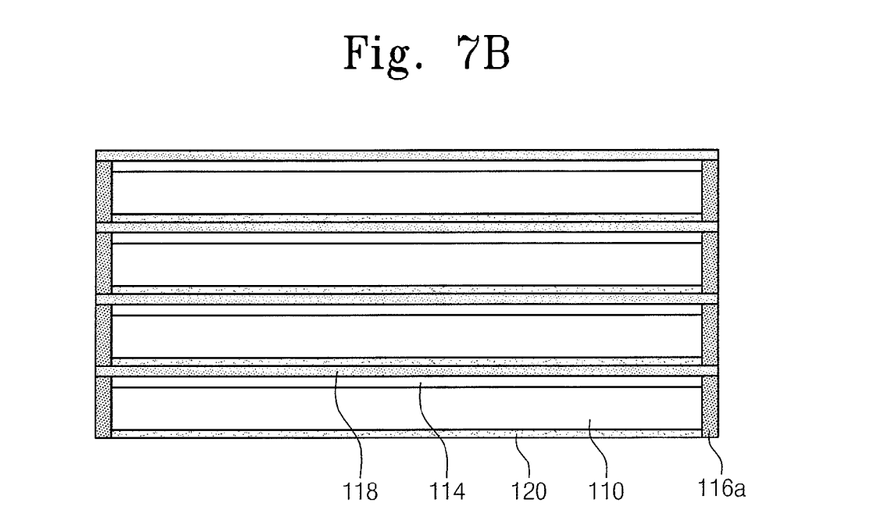

Referring to FIGS. 7A and 7B, in an exemplary embodiment in accordance with principles of inventive concepts, the separated semiconductor chips 110 may be detached from the carrier substrate 210. Next, the semiconductor chips 110 may be stacked in one direction, also referred to herein as a "vertical" direction. The semiconductor chips 110 may all be the same kind of semiconductor chip.

Empty regions may exist between the stacked semiconductor chips 110 due to the openings 119 of the stack-adhesion layers 118, as illustrated in FIGS. 5A and 6A. The empty region may expose the bonding pad 112 and the portions of the passivation layer 114 and the sidewall-insulating layer 116a disposed along a direction from the bonding pad 112 to the edge of the semiconductor chip 110.

Figure 8A:
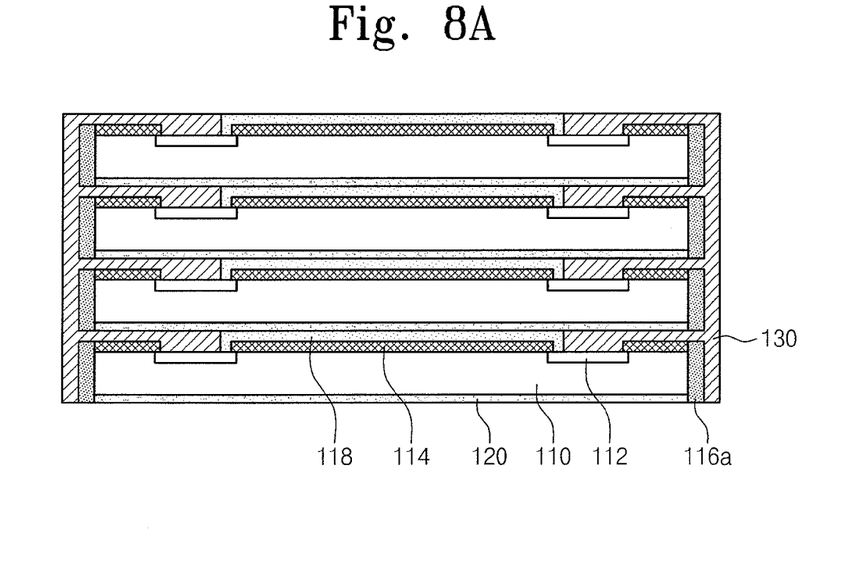
Figure 8B:
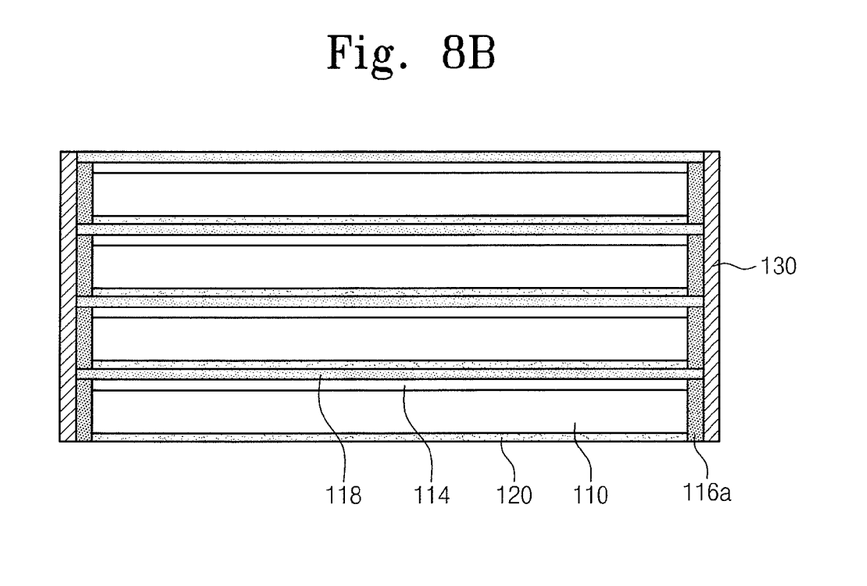

Referring to FIGS. 8A and 8B, in an exemplary embodiment in accordance with principles of inventive concepts, a metal layer 130 may be formed on the exposed bonding pad 112, the exposed portions of the passivation layer 114 and the sidewall-insulating layer 116a, and an outer sidewall of the sidewall-insulating layer 116a.

Figure 9A:
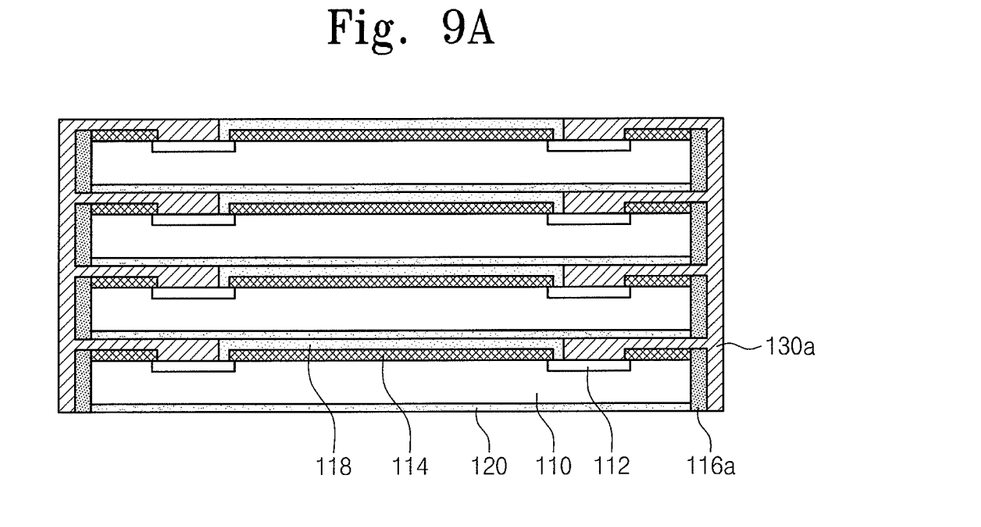
Figure 9B:
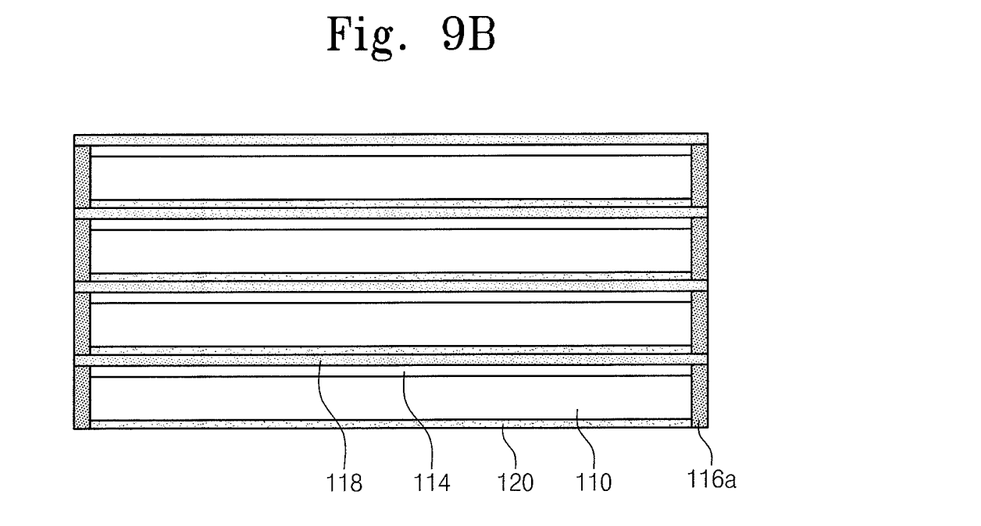

The metal layer 130, which may include copper, may be formed by a plating process, for example. The metal layer 130 may include a seed layer (not shown) and a bulk layer. The bulk layer may be formed by an electroplating process using the seed layer as a seed. For example, the seed layer may be formed using a palladium (Pd)-treatment and/or an electroless plating process, and then the bulk layer may be formed by a copper-electroplating process. Referring to FIGS. 9A and 9B, in accordance with principles of inventive concepts, the metal layer 130 on the outer sidewall of the sidewall-insulating layer 116a may be patterned to form a metal interconnection 130a using a laser etching process or a wet etching process, for example.

In exemplary embodiments of a stacked structure 100 in accordance with principles of inventive concepts, the stacked semiconductor chips 110 may be electrically connected to each other without a bonding wire. In such exemplary embodiments, it is possible to avoid problems that otherwise may occur due to the use of a wire-bonding process. That is, wires employed in the wire-bonding process may be shorted, during a molding step, for example, or wire loops may prevent packages from being as compact as may be desired. The stacked structure 100 in accordance with principles of inventive concepts may, therefore, improve the reliability and allow for more compact packaging, when compared to a wire-bonded structure. Additionally, the stacked semiconductor chips 110 may be electrically connected to each other by a plating process, so that the stacked structure 100 may be easily and inexpensively fabricated with a high degree of efficiency.

Figure 10:
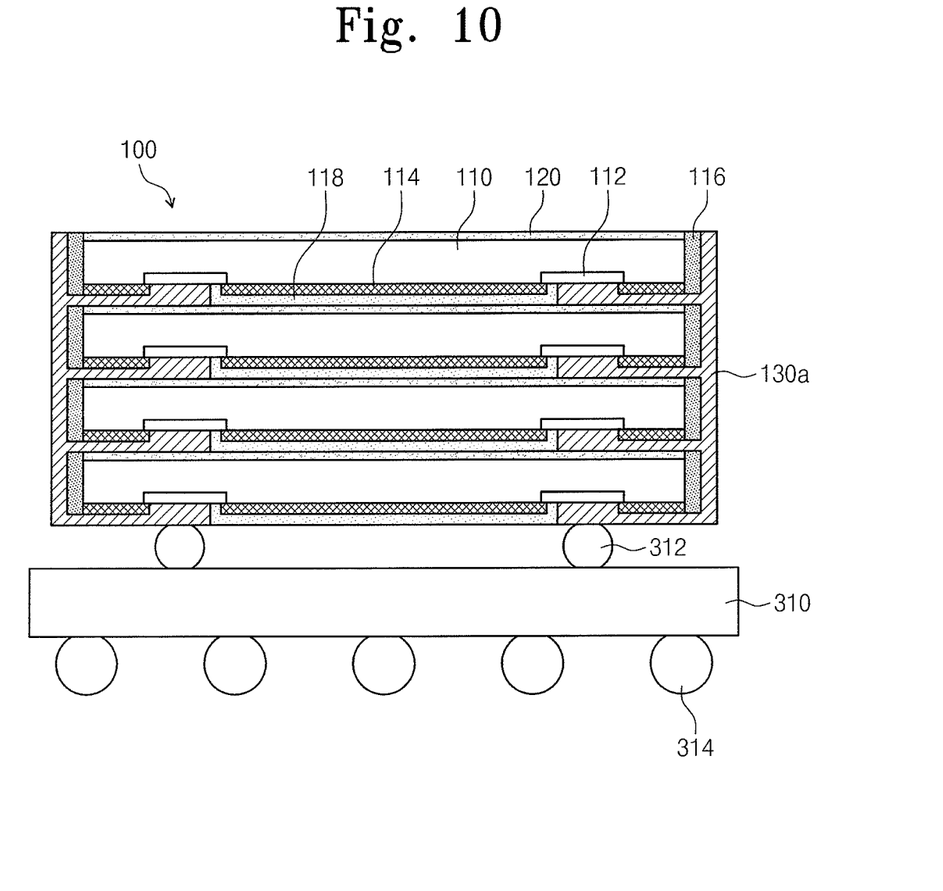
FIG. 10 is a cross-sectional view illustrating an exemplary embodiment of a semiconductor device including stacked semiconductor chips and a method of fabricating the same in accordance with principles of inventive concepts.

FIG. 10 is a cross-sectional view illustrating an exemplary embodiment of a semiconductor device that includes a stacked structure 100 of semiconductor chips and a method of fabricating the same in accordance with principles of inventive concepts.

Referring to FIG. 10, a semiconductor device may include the stacked structure 100 including the semiconductor chips 110 and a wiring substrate 310 on which the stacked structure 100 is mounted.

In accordance with principles of inventive concepts, the wiring substrate 310, which may be implemented as a printed circuit board (PCB), may include a plurality of wirings (not shown), which may be formed internally, for example. Alternatively, the wiring substrate 310 may be a semiconductor substrate (e.g., a silicon substrate, a silicon-germanium substrate, or a silicon-on-insulator (SOI) substrate). The plurality of wirings may include a conductive material.

In an exemplary embodiment in accordance with principles of inventive concepts, the stacked structure 100 of the semiconductor chips 110 may be mounted on, and electrically connected to, the wiring substrate 310 in a flip-chip (F/C) bonding manner. In FIG. 10, the stacked structure 100 is mounted using solder balls 312 for mounting on the wiring substrate 310 in the flip-chip (F/C) bonding manner. However, inventive concepts are not limited thereto. Though not shown in the drawings, the stacked structure 100 may be mounted using the rear surface-adhesion layer 120 of a lowermost semiconductor chip 110 and bonding wires on the wiring substrate 310 in a wire bonding manner, for example.

In accordance with principles of inventive concepts, the semiconductor device may also include at least one external connecting solder ball 314 provided on a lower surface of the wiring substrate 310. The semiconductor device may be mounted on, and electrically connected to, a mother board through the external connecting solder ball 314, for example.

In an exemplary embodiment of a semiconductor device in accordance with principles of inventive concepts, the stacked semiconductor chips 110 may be electrically connected to each other without a bonding wire. In such exemplary embodiments, it is possible to avoid problems that otherwise may occur due to the use of a wire-bonding process. That is, wires employed in the wire-bonding process may be shorted, during a molding step, for example, or wire loops may prevent packages from being as compact as may be desired. The stacked structure 100 in accordance with principles of inventive concepts may, therefore, improve the reliability and allow for more compact packaging, when compared to a wire-bonded structure. Additionally, the stacked semiconductor chips 110 may be electrically connected to each other by a plating process, so that the stacked structure 100 may be easily and inexpensively fabricated with a high degree of efficiency.

Figure 11:
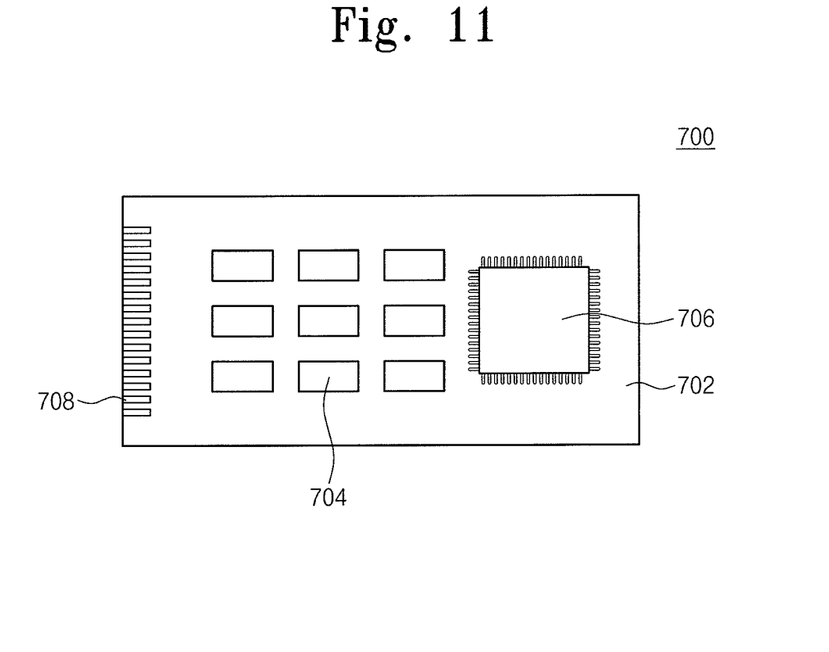
FIG. 11 is a plan view illustrating an exemplary embodiment of a package module in accordance with principles of inventive concepts.

FIG. 11 is a plan view illustrating an exemplary embodiment of a package module in accordance with principles of inventive concepts. A package module 700 may include a module board 702 (including external connecting terminals 708), a semiconductor chip 704 mounted on the module board 702, and a quad flat package (QFP) type of a semiconductor package 706, for example. The semiconductor package 706 may include a semiconductor device having a stacked structure of semiconductor chips in accordance with principles of inventive concepts. The package module 700 may be connected to an external electronic device through the external connecting terminals 708, for example.

Figure 12:
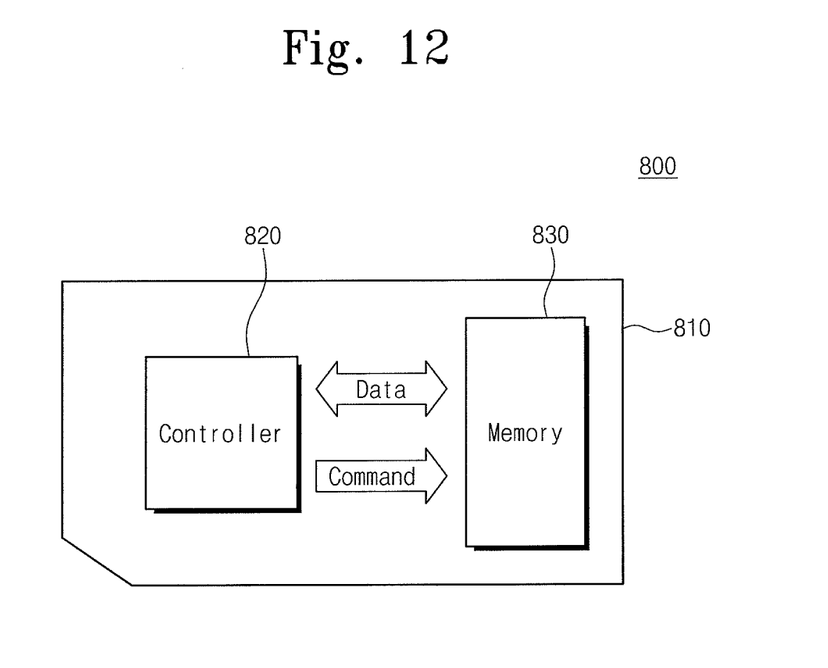
FIG. 12 is a schematic block diagram illustrating an exemplary embodiment of a memory card in accordance with principles of inventive concepts.

FIG. 12 is a schematic block diagram illustrating an exemplary embodiment of a memory card in accordance with principles of inventive concepts. A memory card 800 may include a controller 820 and a memory device 830 in a housing 810. The controller 820 and the memory device 830 may exchange electrical signals with each other. For example, the memory device 830 may exchange data with the controller 820 according to command of the controller 820. Thus, the memory card 800 may store data in the memory device 830 or output data stored in the memory device 830 to an external electronic device, for example.

The controller 820 and/or the memory device 830 may include at least one semiconductor having a stacked structure in accordance with principles of inventive concepts. For example, the controller 820 may include a system-in-a-package and the memory device 830 may include the multi-chip package. In other embodiments, the controller 820 and/or the memory devices 830 may employ stack-type packages in accordance with principles of inventive concepts. The memory card 800 may be used as a data storage medium installed in any of various portable devices. For example, the memory card 800 may be used as a multimedia card (MMC) or a secure digital (SD) card.

Figure 13:
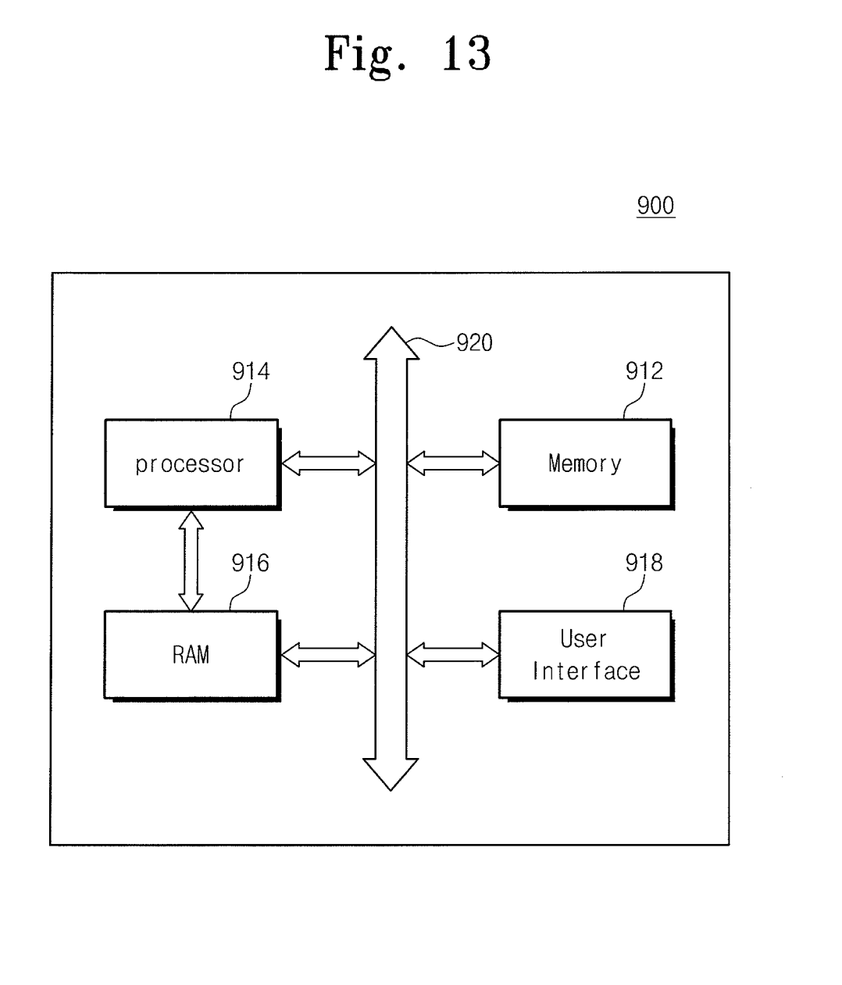
FIG. 13 is a schematic block diagram illustrating an exemplary embodiment of an electronic system in accordance with principles of inventive concepts.

FIG. 13 is a schematic block diagram illustrating an exemplary embodiment of an electronic system in accordance with principles of inventive concepts. An electronic system 900 may include at least one semiconductor device in accordance with principles of inventive concepts. The electronic system 900 may be implemented as a mobile device, such as a smartphone, a tablet, or a notebook, or a computer, for example. In an exemplary embodiment in accordance with principles of inventive concepts, the electronic system 900 may include a memory system 912, a processor 914, a random access memory (RAM) device 916, and a user interface unit 918 which communicate with each other through a data bus 920. The processor 914 may execute a program and control the electronic system 900. The RAM device 916 may be used as an operating memory of the processor 914. Any one, or all, of the processor 914 and the RAM device 916 may include a semiconductor device in accordance with principles of inventive concepts. The processor 914 and the RAM device 916 may be included in one package. The user interface unit 918 may be used for data input/output of the electronic system 900. The memory system 912 may store a code for operating the processor 914, data processed by the processor 914, and/or data inputted from an external electronic device. The memory system 912 may include a controller and a memory device. The memory system 912 may be the same as the memory card 800 illustrated in FIG. 12, for example.

Figure 14:
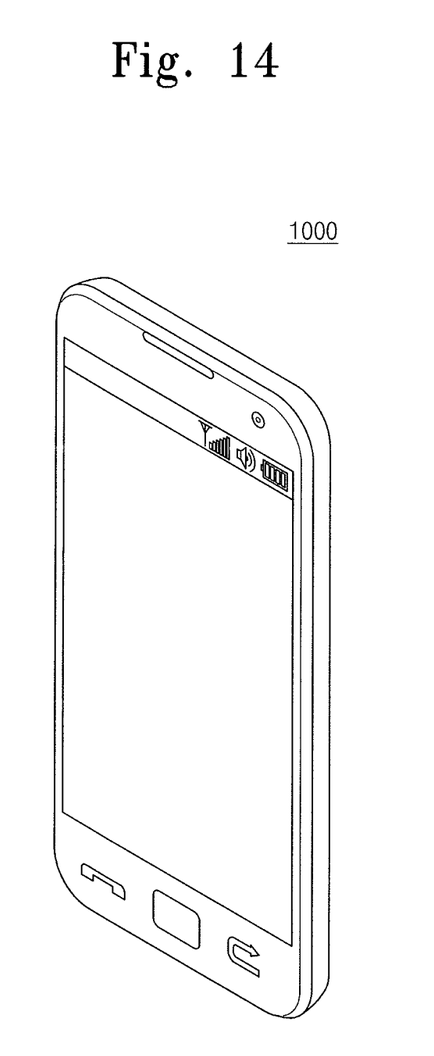
FIG. 14 is a perspective view illustrating an exemplary embodiment of an electronic device in accordance with principles of inventive concepts.

The electronic system 900 of FIG. 13 may be applied to, or employed by, electronic control elements of various electronic devices, for example. FIG. 14 shows an exemplary embodiment of a mobile phone 1000 applied with (that is, which includes) the electronic system 900 of FIG. 13. In other embodiments, the electronic system 900 of FIG. 13 may be applied to a portable notebook computer, a MP3 player, a navigation system, a solid state disk (SSD), a car, and/or household appliances, for example.

As described above, semiconductor chips of a stacked structure in accordance with principles of inventive concepts may be electrically connected to one another without the use of a bonding wire. In such exemplary embodiments, it is possible to avoid problems that otherwise may occur due to the use of a wire-bonding process. That is, wires employed in a wire-bonding process may be shorted, during a molding step, for example, or wire loops may prevent packages from being as compact as may be desired. The stacked structure in accordance with principles of inventive concepts may, therefore, improve the reliability and allow for more compact packaging, when compared to a wire-bonded structure. Additionally, the stacked semiconductor chips may be electrically connected to each other by a plating process, so that the stacked structure may be easily and inexpensively fabricated with a high degree of efficiency.

Inventive concepts have been described with reference to exemplary embodiments. It will be apparent to those skilled in the art that various changes and modifications may be made without departing from the spirit and scope of inventive concepts. Therefore, it should be understood that the above embodiments are not limiting, but illustrative, and that the scope of inventive concepts is to be determined by the broadest permissible interpretation of the following claims and their equivalents, and shall not be restricted or limited by the foregoing description.

What is claimed is:

1. A stacked structure of semiconductor chips comprising:
   semiconductor chips stacked in one direction; and
   an interconnection member electrically connecting the semiconductor chips to each other in the one direction,
   wherein each of the semiconductor chips comprises:
   a first surface and a second surface opposite to each other and a sidewall connecting the first and second surfaces;
   a bonding pad disposed on the first surface;
   a passivation layer disposed on the first surface, the passivation layer including a first opening to expose the bonding pad;
   a sidewall-insulating layer disposed on the sidewall; and
   a first adhesion layer disposed on the passivation layer and the sidewall-insulating layer and having a second opening,
   wherein the second opening exposes the bonding pad and extends from the bonding pad to the sidewall-insulating layer to expose a portion of the passivation layer and a portion of the sidewall-insulating layer; and
   wherein the interconnection member is disposed on the exposed bonding pad, the exposed portion of the passivation layer, and the exposed portion of the sidewall-insulating layer and extends on the sidewall-insulating layer in the one direction to connect to an interconnection member of another semiconductor chip.

2. The stacked structure of claim 1, wherein the semiconductor chips are the same type of semiconductor chip.

3. The stacked structure of claim 1, wherein each of the semiconductor chips further comprises:
   a second adhesion layer disposed on the second surface.

4. The stacked structure of claim 1, wherein the sidewall-insulating layer covers sidewalls of the second adhesion layer and the passivation layer.

5. The stacked structure of claim 1, wherein the sidewall-insulating layer includes an epoxy resin and/or an epoxy molding compound.

6. A semiconductor device comprising:
   the stacked structures of the semiconductor chips of claim 1; and
   a wiring substrate on which the stacked structure is mounted.

7. The semiconductor device of claim 6, wherein the stacked structure is mounted on the wire substrate with a flip-chip bonding process.

* * * * *